(12) United States Patent
Ota et al.

(10) Patent No.: US 6,219,165 B1
(45) Date of Patent: Apr. 17, 2001

(54) BURST-MODE LASER TECHNIQUES

(75) Inventors: Yusuke Ota, Mountain Lakes; Eduard Sackinger, Shrewsbury, both of NJ (US)

(73) Assignee: Agere Systems Optoelectronics Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/112,221

(22) Filed: Jul. 9, 1998

(51) Int. Cl.[7] ................................................. H04J 14/08
(52) U.S. Cl. ........................ 359/187; 359/135; 359/189
(58) Field of Search ................................... 359/187, 161, 359/168, 135, 194; 375/320, 317, 353, 228, 318

(56) References Cited

U.S. PATENT DOCUMENTS

| 5,285,305 | * | 2/1994 | Cohen et al. | 359/110 |
| 5,469,464 | * | 11/1995 | De Groote et al. | 375/317 |
| 6,140,920 | * | 10/2000 | Roberts | 340/514 |

OTHER PUBLICATIONS

T. Inoue et al: "Burst–mode CMOS LD driver IC for 156 Mbit/s transmission", Electronics Letters: vol. 33, No. 9, Apr. 24, 1997.

N. Ishihara et al: "3.3V, 50Mb/s CMOS Transceiver for Optical Burst–Mode Communication", 1997 IEEE International Solid–State Circuits Conference–1997 Digest of Technical Papers, vol. 40, ISSN 0193–6530/Paper FP 15.4.

* cited by examiner

*Primary Examiner*—Leslie Pascal
*Assistant Examiner*—Dalzid Singh
(74) *Attorney, Agent, or Firm*—Eugene J. Rosenthal

(57) ABSTRACT

Power control for a laser used for bust mode communication as well as end-of-life detection for the laser are performed in a combined manner, resulting in a savings in both cost and power consumption. This is achieved by employing a peak comparator which is supplied with an indication of the magnitude of a the laser signal, and supplying to the peak comparator in a time multiplexed manner with different thresholds, such as a first threshold which is used for performing power control and a second threshold which is used for performing end of life detection, on an alternative packet-by-packet basis. Thus, the first threshold is supplied for the duration of a first packet and the second threshold is used for the duration of a second packet. Additional thresholds and packets may be employed for other functions as desired by an implementor.

31 Claims, 2 Drawing Sheets

BURST-MODE LASER TECHNIQUES

TECHNICAL FIELD

This invention relates to the art of controlling generated signals, and more particularly, to controlling a laser used for burst mode transmission in a passive optical network (PON).

BACKGROUND OF THE INVENTION

In prior art optical networks using continuous signal format, power control for the laser and end-of-life detection for the laser are performed independently, resulting in high cost and substantial power consumption. Moreover, when using a bursty signal format, no end-of-life detection was performed in prior art optical networks.

SUMMARY OF THE INVENTION

We have recognized that for optical networks using a bursty signal format power control for the laser as well as end-of-life detection for the laser can be combined, resulting in a savings in both cost and power consumption. This is achieved by employing a peak comparator which is supplied with an indication of the magnitude of a generated, e.g., laser, signal, and supplying different thresholds to the peak comparator in a time multiplexed manner, such as a first threshold which is used for performing power control and a second threshold which is used for performing end of life detection, on an alternative packet-by-packet basis. Thus, the first threshold is supplied for the duration of a first packet and the second threshold is used for the duration of a second packet. Additional thresholds and packets may be employed for other functions as desired by an implementor.

DETAILED DESCRIPTION

Figure 1:
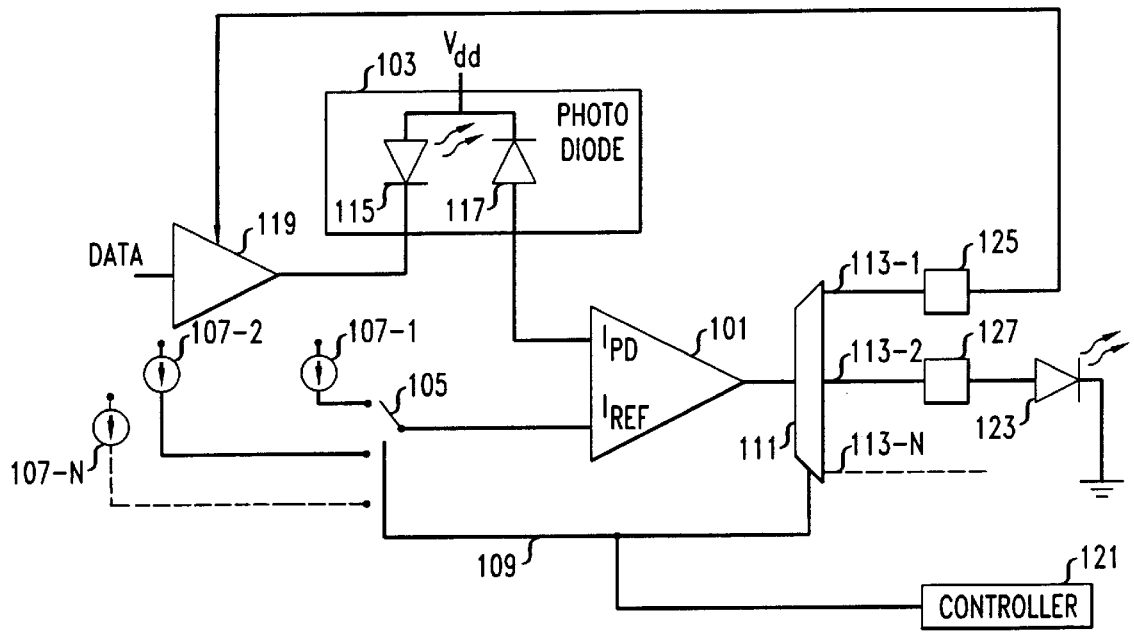
FIG. 1 shows an exemplary arrangement for performing power control and end-of-life detection for a source in accordance with the principles of the invention.

The following merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams herein represent conceptual views of illustrative circuitry embodying the principles of the invention. Similarly, it will be appreciated that the various flow charts, flow diagrams, state transition diagrams, pseudocode, and the like represent various processes which may be substantially represented in computer readable medium and so executed by a computer or processor, whether or not such computer or processor is explicitly shown.

The functions of the various elements shown in the FIGs., including functional blocks labeled as "processors" may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, read-only memory (ROM) for storing software, random access memory (RAM), and non-volatile storage. Other hardware, conventional and/or custom, may also be included. Similarly, any switches shown in the FIGS. are conceptual only. Their function may be carried out through the operation of program logic, through dedicated logic, through the interaction of program control and dedicated logic, or even manually, the particular technique being selectable by the implementor as more specifically understood from the context.

In the claims hereof any element expressed as a means for performing a specified function is intended to encompass any way of performing that function including, for example, a) a combination of circuit elements which performs that function or b) software in any form, including, therefore, firmware, microcode or the like, combined with appropriate circuitry for executing that software to perform the function. The invention as defined by such claims resides in the fact that the functionalities provided by the various recited means are combined and brought together in the manner which the claims call for. Applicant thus regards any means which can provide those functionalities as equivalent as those shown herein.

FIG. 1 shows an exemplary arrangement for performing power control and end-of-life detection for a source in accordance with the principles of the invention. More specifically, shown in FIG. 1 are a) peak comparator 101; b) source 103; c) N input multiplexer 105; d) threshold sources 107, including threshold sources 107-1 through 107-N; e) control line 109, f) N output demultiplexer 111; g) controllable gain driver 119; h) controller 121; i) alarm light emitting diode (LED) 123; and j) value stores 125 and 127. Peak comparator 101 is arranged to compare the magnitude of the pulses supplied from source 103 against a threshold level supplied by one of threshold sources 107 that is controllably passed via N input multiplexer 105.

Source 103 may be any type of source, e.g., a voltage source or a current source. When used to control laser power, such as for use in a passive optical network (PON), source 103 may be made up of photodiode 117 which is optically coupled to laser 115. The signal output by photodiode 117 is directly proportional to the output power supplied by laser 115. Photodiode 117 is considerably more stable than laser 115 in terms of their respective responses to temperature and age variations. As a result changes in the signal supplied as an output from photodiode 117 reflect, essentially, changes in the output of laser 115.

The pulses supplied from source 103 are grouped in packets, which may be supplied in a bursty manner. Depending on the implementation, either the instantaneous peak magnitude of the pulses may be used, or the average peak magnitude of the bits over a packet may be used, as will be described in more detail hereinbelow.

In accordance with an aspect of the invention, the particular threshold values depend on the operation desired to be performed when the corresponding threshold source is selected. For example, for use in performing power control, one of threshold sources 107, e.g., threshold source 107-1, is set to the current level which would be generated by photodiode 117 when laser 115 is supplying the desired power level for typical use, as specified by a user, such as to meet PON communication requirements for a particular link length. Similarly, for use in performing end-of-life detection, one of threshold sources 107, e.g., threshold source 107-2, is set to the current level which would be generated by photodiode 117 when laser 115 is nearing the end of its useful life as specified by the user, e.g., one half or one third of the power level desired for typical use.

Other threshold sources 107, e.g., threshold source 107-N, may be used for other user specified functions, e.g., to provide an early end of life warning or other function desired by the user. Those of ordinary skill in the art will be able to develop such functions and specify appropriate thresholds therefor.

Both multiplexer 105 and demultiplexer 111 are responsive to a signal supplied on control line 109 by controller 121. More specifically, in accordance with the principles of the invention, for each packet, controller 121 supplies a signal specifying a particular one of threshold sources 107 to be passed by multiplexer 105 and a particular one of outputs 113 of demultiplexer 111 to which the output of peak comparator 101 is to be supplied. For example, when there are only two threshold sources 107, a single binary signal may be supplied by controller 121 to select the desired threshold. To this end, a logic 1 would select one of threshold sources 107 and a corresponding output 113 of demultiplexer 111 and a logic 0 would select the other one of threshold sources 107 and its corresponding output 113 of demultiplexer 111.

Figure 3:
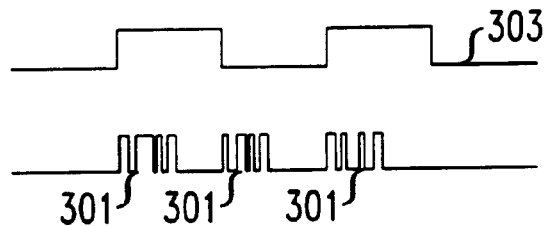
FIG. 3 is an exemplary timing diagram showing the bits of various packets and the signal generated as an output by the controller of FIG. 1.

FIG. 3 is an exemplary timing diagram for one embodiment of the invention. Shown in FIG. 3 are the bits of various packets 301 and signal 303 generated as an output by controller 121 (FIG. 1). Other timing variations may be developed by the implementor. For example, controller 121 could switch between two threshold sources only after having selected a particular threshold for two packet times. In such an embodiment the first of the two successive packets having a particular threshold is used for a reset function, which may be necessary in certain embodiments for precharging various components, as described in further detail hereinbelow in connection with FIG. 4, and the second packet of the two successive packets is used for the actual power control or end-of-life detection. There may also be unused packets in between the packets selected for power control and the end-of-life detection, as well as separating any reset function packets from comparison packets. Moreover, depending on the number of thresholds employed, controller 121 may generate more than one bit of output.

Continuing with the example above, for a packet for which there is the performance of power control, threshold source 107-1 is set to the peak current level which would be generated by photodiode 117 when laser 115 is supplying the desired power level for typical use, as specified by a user. Controller 121 supplies to control line 109 a signal so that multiplexer 105 selects threshold source 107-1, and similarly, demultiplexer 111 selects output 113-1. If the peak power from photodiode 117 is less than the value of the power control threshold supplied by power control threshold source 107-1, the output signal supplied by peak comparator 101 will increase. This increased output will be supplied via demultiplexer 111 through output 113-1 to controllable gain driver 119, which will increase the gain driving laser 115, so as to increase the light output of laser 115, if it is not already at its maximum. Conversely, if the peak power from photodiode 117 is greater than the value of the power control threshold supplied by power control threshold source 107-1, the output signal supplied by peak comparator 101 will decrease. This decreased output will be supplied via demultiplexer 111 through output 113-1 to controllable gain driver 119, which will decrease the gain driving laser 115, so as to decrease the light output of laser 115.

Similarly, for a packet for which there is the performance of end-of-life detection, threshold source 107-2 is set to the peak current level which would be generated by photodiode 117 when laser 115 is at the power level specified as corresponding to the end-of-life of laser 115. Controller 121 supplies to control line 109 a signal so that multiplexer 105 selects threshold source 107-2, and similarly, demultiplexer 111 selects output 113-2. If the peak power from photodiode 117 is greater than the value of the end-of-life threshold supplied by power control threshold source 107-2, the output signal supplied by peak comparator 101 will be a low value, and in particular, one that is too low to turn on alarm LED 123. This low output will be supplied via demultiplexer 111 through output 113-2 to alarm LED 123, which will remain off. However, if the peak power from photodiode 117 is less than the value of the end-of-life threshold supplied by power control threshold source 107-2, the output signal supplied by peak comparator 101 will be a high value, and in particular, one that is high enough to turn on alarm LED 123. This high output will be supplied via demultiplexer 111 through output 113-2 to alarm LED 123, which will turn on, indicating to the user that the end of the useful life of laser 115 is at hand.

Note that each of value stores 125 and 127 pass through any value supplied to them from demultiplexer 111. Furthermore, when a value is not being supplied by demultiplexer 111 each of value stores 125 and 127 continues to supply the last value supplied to it when a value was being supplied to it by demultiplexer 111. Thus, an open circuit condition which might otherwise occur when demultiplexer 111 selects a different one of outputs 113 than it had previously selected is avoided. Value stores 125 and 127 may be implemented in either analog or digital form, and they need not be the same. Value stores 125 and 127 may be series types, as shown in FIG. 1. or parallel types.

Figure 2:
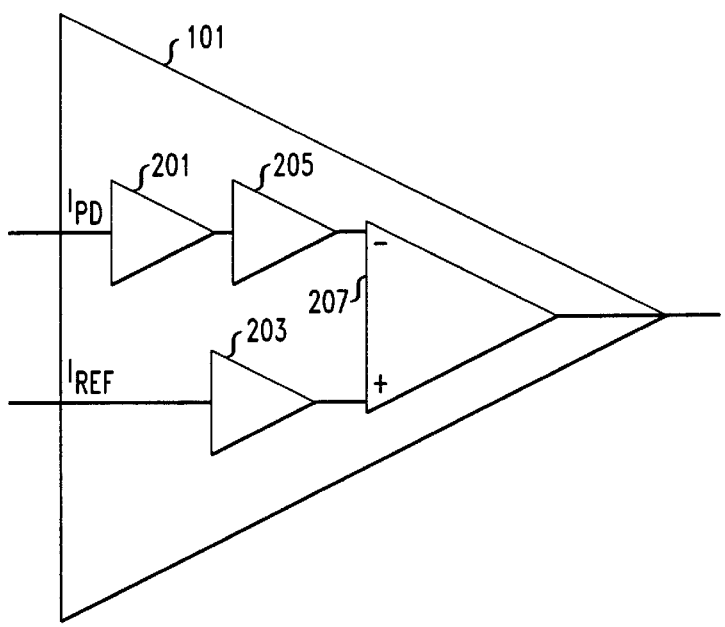
FIG. 2 shows an exemplary embodiment of a peak comparator.

FIG. 2 shows an exemplary embodiment of peak comparator 101 (FIG. 1). Peak comparator 101 is supplied with currents $I_{pd}$ and $I_{ref}$, as shown in FIG. 1. Current $I_{pd}$ is supplied to current to voltage converter 201 (FIG. 2), while $I_{ref}$ is supplied to current to voltage converter 203. Preferably, current to voltage converters 201 and 203 have substantially the same transresistance. Thus, each of the applied currents are converted into voltages. The voltage supplied as an output from current to voltage converter 201, which represents the signal from source 103 (FIG. 1), is supplied to peak detector 205 (FIG. 2), which supplies as an output the peak voltage it detects to voltage comparator 207. The signal supplied as an output from current to voltage converter 203, which represents the signal from one of threshold sources 107, is also supplied to voltage comparator 207. Voltage comparator 207 compares the two voltages supplied to it and supplies as an output a signal indicative of which input is greater. For example, voltage comparator 207 may supply as an output a signal which is an amplified version of the difference between the voltage supplied by current to voltage converter 203 and peak detector 205. Depending on the gain of voltage comparator 207, the output supplied thereby can be either only the extremes of the voltages that can be generated by voltage comparator 207, to yield a digital type of signal; or it can also take on various values between the extremes of the voltages that can be generated by voltage comparator 207, to yield an analog type of signal.

Figure 4:
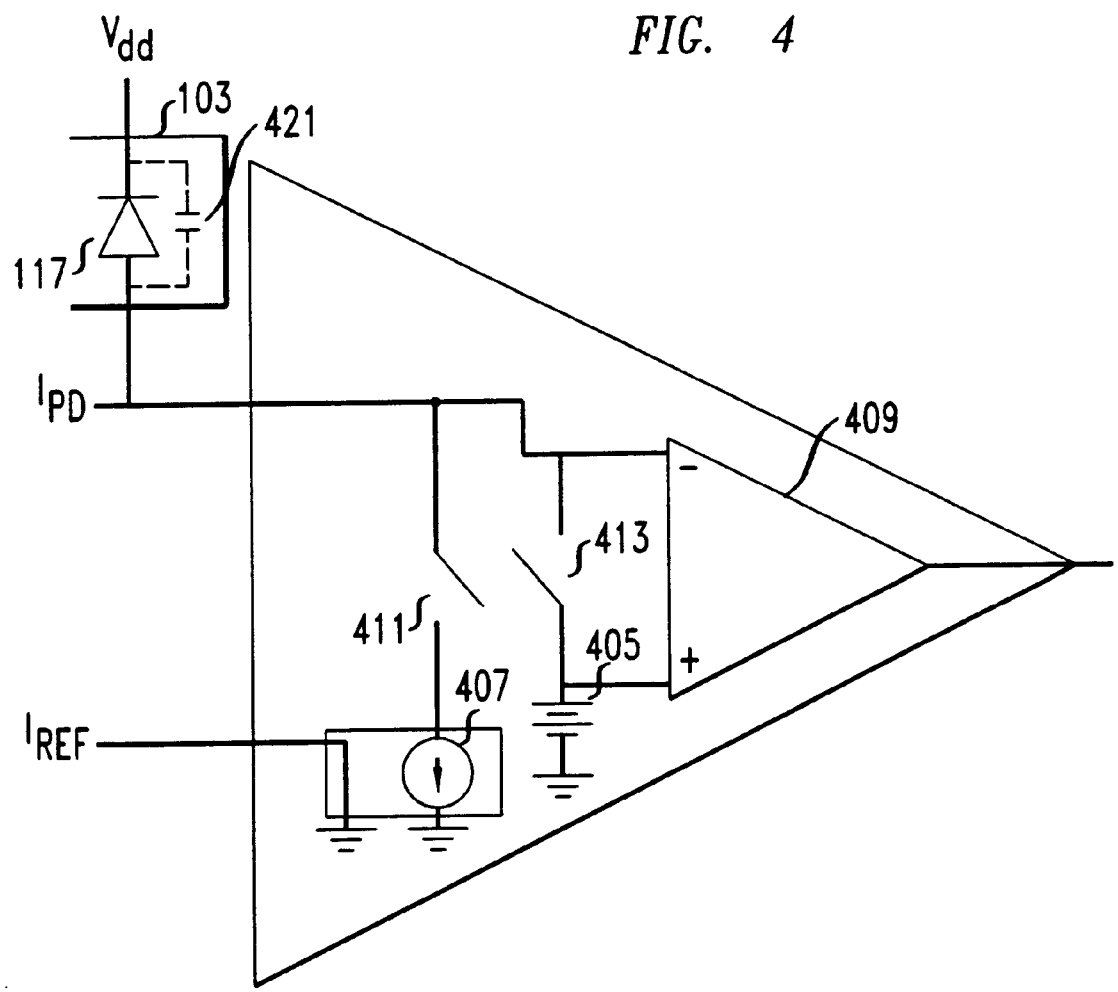
FIG. 4 shows another exemplary peak comparator.

FIG. 4 shows another exemplary peak comparator for use in performing power control or end-of-life detection for a source, in accordance with the principles of the invention. More specifically, shown in FIG. 4 are a) precharge voltage source 405, b) threshold current source 407, c) comparator 409 d) switches 411 and 413, and e) capacitor 421.

Within source 103 is capacitor 421. Capacitor 421 is not shown explicitly, because, typically, it is an inherent part of source 103, i.e., it is a parasitic capacitance of photodiode 117. However, an explicit capacitor may be used, or an explicit capacitor may be used in conjunction with the parasitic capacitance of photodiode 117.

In operation, prior to the beginning of a packet reset switch 413 is closed. This precharges capacitor 421 to the voltage of precharge voltage source 405. Thereafter, reset switch 413 is opened. Then, the packet is transmitted.

During the period of transmission switch 411 closes each time a pulse of light is generated by laser 115 for the duration light is emitted. This causes a current to be injected from threshold current source 407 into capacitor 421. The value of this current is set by the selected one of current sources 107 (FIG. 1), which is current mirrored by threshold current source 407 (FIG. 4). Thus, the magnitude of the injected current pulses is the threshold level against which the output of source 403 is being compared. During the transmission of the packet there is an integration by capacitor 421 of the output of photodiode 117 and the current injected from threshold current source 407. The injected current from threshold current source 407 and the output of photodiode 117 are arranged to combine in a subtractive manner.

As a result, if the injected current from threshold current source 407 and the output of photodiode 117 are not substantially identical, the voltage on capacitor 425 may change, i.e., it will either increase or decrease. At the end of the packet transmission, the resulting voltage on capacitor 421 is compared against the voltage of precharge voltage source 405 by comparator 409.

When using the peak comparator shown in FIG. 4, value store 125 (FIG. 1) may be implemented as an up/down counter, which further advantageously provides a filtering effect, and value store 127 may be implemented as a flip flop. If value stores 125 and 127 are so implemented, demultiplexer 111 may be implemented using the enabling logic of the up/down counter and flip flop.

What is claimed is:

1. An apparatus, comprising:
   a detector for detecting a magnitude of a signal representing bits in a packet generated by a source;
   a comparator for comparing said detected magnitude to a supplied threshold level;
   wherein for a first packet a first threshold level is supplied and for a second packet a second threshold level is supplied, said first threshold being for use in controlling said magnitude of said signal generated by said source and said second threshold being for use in generating an alarm for said source.

2. The invention as defined in claim 1 wherein said detector is a peak detector.

3. The invention as defined in claim 1 wherein said alarm is an end-of-life indicator.

4. The invention as defined in claim 1 wherein said first and second packets are immediately adjacent packets.

5. The invention as defined in claim 1 wherein said first and second packets are not immediately adjacent packets.

6. The invention as defined in claim 1 wherein said first packet precedes said second packet in time.

7. The invention as defined in claim 1 wherein said second packet precedes said first packet in time.

8. The invention as defined in claim 1 further including a multiplexer for supplying said first threshold for said first packet and said second threshold for said second packet.

9. The invention as defined in claim 1 further including a demultiplexer for supplying an output of said comparator to a first location during said first packet and to a second location during said second packet.

10. The invention as defined in claim 1 wherein said first threshold level is a first current level and said second threshold is a second current level.

11. The invention as defined in claim 1 wherein said first threshold level is a first current level and said second threshold is a second current level substantially equal to one half of said first current level.

12. The invention as defined in claim 1 wherein said first threshold level is a first current level and said second threshold is a second current level which is controllable in response to a selection by a user.

13. The invention as defined in claim 1 wherein said first threshold level is a first voltage level and said second threshold is a second voltage level.

14. The invention as defined in claim 1 wherein said first threshold level is a first voltage level and said second threshold is a second current level substantially equal to one half of said first voltage level.

15. The invention as defined in claim 1 wherein for a third packet a third threshold level is supplied.

16. The invention as defined in claim 1 wherein said threshold levels are arranged to be supplied in a format which is the same as said bits in said packet generated by said source.

17. The invention as defined in claim 1 further including an adjustable gain amplifier that is responsive to an output of said comparator indicating a result of said comparison when said first threshold level is said supplied threshold level.

18. The invention as defined in claim 1 further including an adjustable gain amplifier that is coupled to a light generator to control a brightness generated thereby and is responsive to an output of said comparator indicating a result of said comparison when said first threshold level is said supplied threshold level.

19. An apparatus, comprising:
   a peak comparator for detecting a magnitude of a signal representing a plurality of bits in a packet generated by a source and comparing said detected magnitude to a supplied threshold level; and
   a multiplexer for selecting said threshold level supplied to said peak comparator;

wherein for a first packet said multiplexer selects a first threshold level to be supplied and for a second packet said multiplexer selects a second threshold level to be supplied, said first threshold being for use in controlling said magnitude of said signal generated by said source and said second threshold being for use in generating an alarm for said source.

20. The invention as defined in claim 19 wherein said alarm is an end-of-life indicator.

21. The invention as defined in claim 19 wherein said first and second packets are immediately adjacent packets.

22. The invention as defined in claim 19 wherein said first and second packets are not immediately adjacent packets.

23. The invention as defined in claim 19 further including a demultiplexer for supplying an output of said comparator to a first location during said first packet and to a second location during said second packet.

24. The invention as defined in claim 19 for a third packet said multiplexer selects a third threshold level to be supplied.

25. The invention as defined in claim 19 wherein said peak comparator comprises:

a precharge voltage source, for charging a capacitor associated with said source to a precharge voltage and for comparing a resulting voltage on said capacitor against;

means for applying a current indicative of said selected threshold level to said capacitor; and a comparator for comparing a resulting voltage on said capacitor after said plurality of bits of said packet have been transmitted against said precharge voltage.

26. A method comprising the steps of:

evaluating a representation of a magnitude of bits of a first packet generated by a source with respect to a first threshold, said first threshold being for use in controlling said magnitude of said signal generated by said source;

evaluating a representation of a magnitude of bits of a second packet generated by said source with respect to a second threshold, second threshold being for use in generating an alarm for said source;

wherein said evaluating steps are performed on a per-packet basis, said first and second thresholds being supplied in a multiplexed manner, each of said first and second thresholds being supplied for at least a respective one of a plurality of packets.

27. The invention as defined in claim 26 wherein said representation of a magnitude of bits is an average peak magnitude.

28. The invention as defined in claim 26 wherein said evaluating steps are performed by a peak comparator.

29. Apparatus comprising:

a plurality of threshold level suppliers;

a multiplexer for selecting a particular threshold level supplied as an output by one of said plurality of threshold level suppliers;

a peak comparator for detecting a magnitude of a signal representing bits in a packet generated by a source and comparing said detected magnitude to a threshold level supplied as said output of said multiplexer, said peak comparator supplying an output indicative a result of said comparing; and a demultiplexer for routing said output of said peak comparator;

wherein for a first packet said multiplexer selects a first threshold level supplier and for a second packet said multiplexer selects a second threshold level supplier, said first threshold level supplier supplying a threshold level representative of a user specified acceptable operational level for said magnitude of said signal generated by said source and said second threshold being representative of a user specified anomalous operational level for said magnitude of said signal generated by said source.

30. The invention as defined in claim 29 wherein, when said first threshold level supplier is selected by said multiplexer said demultiplexer couples said peak detector output to a controllable driver which regulates, within prescribed limits, said magnitude of said signal as a function of said peak detector output.

31. The invention as defined in claim 29 wherein, when said second threshold level supplier is selected by said multiplexer said demultiplexer couples said peak detector output to an indicator of an alarm condition of said source.

* * * * *